US012775036B2

(12) United States Patent
Ciubotaru et al.

(10) Patent No.: US 12,775,036 B2
(45) **Date of Patent: *Oct. 27, 2026**

(54) ON-CHIP CAPACITANCE MEASUREMENT METHOD AND APPARATUS

(71) Applicant: Qorvo US, Inc., Greensboro, NC (US)

(72) Inventors: Alexandru Aurelian Ciubotaru, Coconut Creek, FL (US); Jeroen Kuenen, Beuningen (NL)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/049,134

(22) Filed: Feb. 10, 2025

(65) Prior Publication Data

US 2025/0244370 A1 Jul. 31, 2025

Related U.S. Application Data

(63) Continuation of application No. 18/309,863, filed on May 1, 2023, now Pat. No. 12,265,108.

(Continued)

(51) Int. Cl.
*G01R 27/26* (2006.01)
*H03B 5/24* (2006.01)

(52) U.S. Cl.
CPC .......... *G01R 27/2605* (2013.01); *H03B 5/24* (2013.01); *H03B 2200/004* (2013.01)

(58) Field of Classification Search
CPC .................................................. G01R 27/2605

(Continued)

(56) References Cited

U.S. PATENT DOCUMENTS 10,236,900 B1 3/2019 Loveless et al.
12,265,108 B2 * 4/2025 Ciubotaru .......... G01R 31/2884

(Continued)

OTHER PUBLICATIONS

Leme, C.A. et al., "CMOS Absolute Value Precision Capacitance Measurement System," Proceedings of the 1992 IEEE International Symposium on Circuits and Systems, May 10-13, 1992, San Diego, CA, USA, IEEE, pp. 1277-1279.

(Continued)

*Primary Examiner* — Joseph Chang

(74) *Attorney, Agent, or Firm* — Withrow & Terranova, P.L.L.C.

(57) ABSTRACT

An on-chip capacitance measurement method and associated systems and devices are provided. Embodiments described herein rely on using the capacitor under test in an on-chip relaxation oscillator configuration whose charging/discharging currents, supply voltage, and output frequency are measured individually in a measurement block. The voltage thresholds of the relaxation oscillation are calculated from the circuit elements and the measured supply voltage. Because the oscillation frequency of the relaxation oscillator is a function of the capacitance under test, the charging/discharging currents, and the supply voltage (via voltage thresholds), the capacitance under test can be calculated using the measured values of the other quantities. Embodiments described herein provide an accurate, low-power, small-area on-chip system capable of measuring capacitance with high accuracy. An algorithm employing the above method and apparatus for tuning a crystal oscillator is also provided. Relevant circuit implementations used in the on-chip measurement system are also disclosed.

17 Claims, 13 Drawing Sheets

Related U.S. Application Data

(60) Provisional application No. 63/346,558, filed on May 27, 2022.

(58) Field of Classification Search
USPC .......................................................... 331/111
See application file for complete search history.

(56) References Cited

U.S. PATENT DOCUMENTS

| | | | |
|---|---|---|---|
| 2001/0033177 | A1 | 10/2001 | Lindolf et al. |
| 2012/0025841 | A1 | 2/2012 | Kim et al. |

OTHER PUBLICATIONS

Iwai, H. et al., "A Scaleable Technique for the Measurement of Intrinsic MOS Capacitance with Atto-Farad Resolution," IEEE Journal of Solid-State Circuits, vol. 20, Issue 1, Feb. 1985, IEEE, pp. 264-276.
Vendrame, L. et al., "Accuracy Assessment and Improvement of On-Chip Charge-Based Capacitance Measurements," Proceedings of the 7th IEEE SPI Workshop, Jan. 2002, 4 pages.
Zhu, D. et al., "A New Capacitance-to-Frequency Converter for On-Chip Capacitance Measurement and Calibration in CMOS Technology," Journal of Electronic Testing, vol. 32, No. 3, Apr. 2016, Springer, 5 pages.
Extended European Search Report for European Patent Application No. 23172479.0, mailed Oct. 20, 2023, 6 pages.

* cited by examiner

ON-CHIP CAPACITANCE MEASUREMENT METHOD AND APPARATUS

RELATED APPLICATIONS

This application is a continuation of U.S. patent application Ser. No. 18/309,863, filed May 1, 2023, now U.S. Pat. No. 12,265,108, which claims the benefit of provisional patent application Ser. No. 63/346,558, filed May 27, 2022, the disclosures of which are hereby incorporated herein by reference in their entireties.

FIELD OF THE DISCLOSURE

The present disclosure relates to testing, calibration, and tuning of integrated circuits, such as oscillator circuits.

BACKGROUND

Modern clocking circuits in integrated circuits require stable frequency references (e.g., oscillators) with fast turn-on, small output noise, and small power consumption. Because of stringent frequency stability requirements, an external resonator with a high-quality factor (such as a quartz crystal) is usually employed in conjunction with active components in the integrated circuit for generating the reference oscillations.

Furthermore, although capacitive load adjustments can be made for finely changing the oscillation frequency during normal operation, an accurate capacitive load must usually be provided for the resonator to prevent excessive frequency deviations in the absence of other adjustments. Although there are means to provide an integrated adjustable capacitance to a resonator, prescribing the value of this capacitance with good accuracy is a challenge because the capacitance in question must be measured against known standards. Additional challenges are presented by the unavailability of proper stimuli and/or circuitry for their application in complex systems (such as integrated transceivers) and by the low-supply-voltage environments where the active devices (such as transistors) must operate with small headroom voltages.

Several drawbacks associated with accurately measuring on-chip capacitance can be identified in the prior art. FIG. 1A is a circuit diagram of a previously proposed capacitance measurement approach based on measurement of transient currents. Such transient currents can be affected by the nonidealities of the comparator—e.g., finite gain and delay, which may cause capacitance over-charge and over-discharge, as well as oscillatory settling. In addition, the capacitance is inferred from a measured average current, which requires filtering of sharp current pulses and consequently relies on large on-chip capacitances, resulting in a relatively long settling time. To minimize comparator error contributions, the injected measurement frequency can be set to low values, further increasing the required averaging on-chip capacitance and measurement time.

Figure 1B:
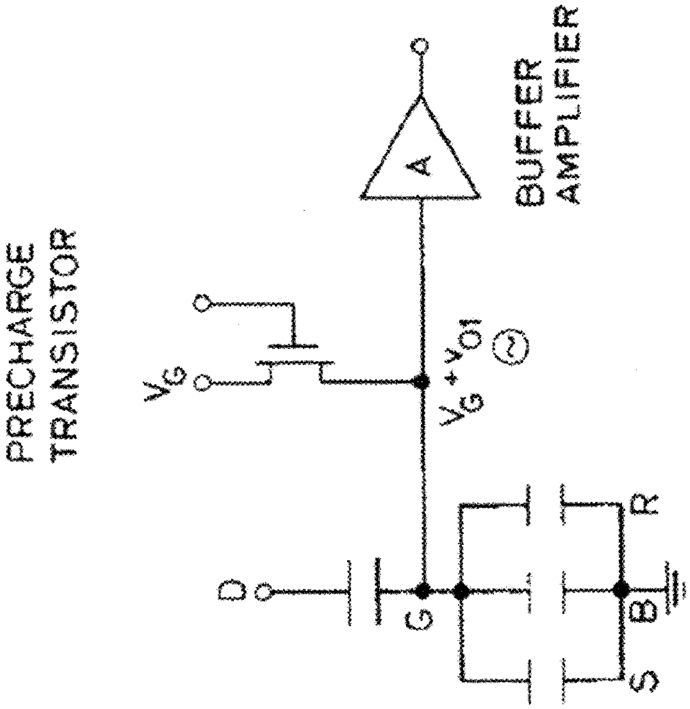
FIG. 1B (PRIOR ART)
FIG. 1B is a circuit diagram of another previously proposed capacitance measurement approach based on measuring amplitudes of sinusoidal signals. This approach is inherently inaccurate and difficult to perform in integrated systems.
Figure 1A:
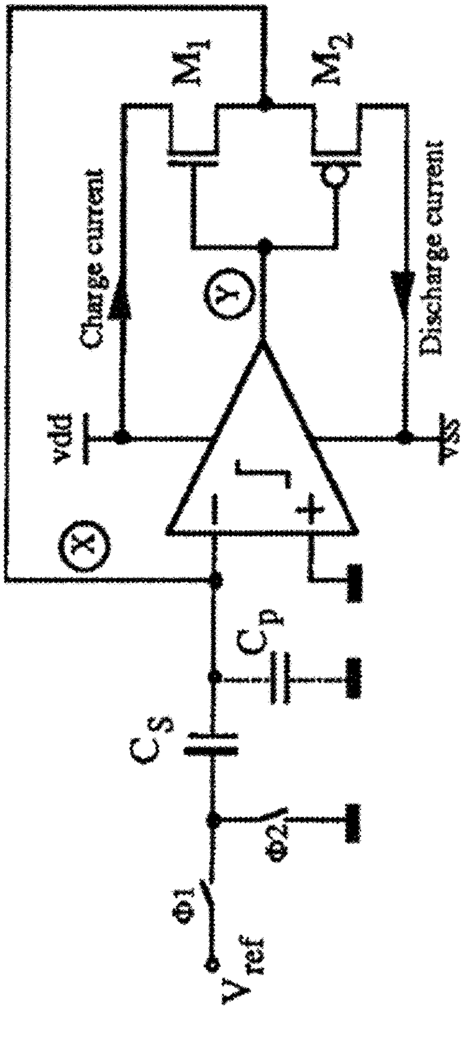
FIG. 1A (PRIOR ART)
FIG. 1C is a circuit diagram of another previously proposed capacitance measurement approach. Under this approach, there is also a need to measure average currents, with the inherent burden of filtering capacitor size and long measurement time due to settling.
Figure 1C:
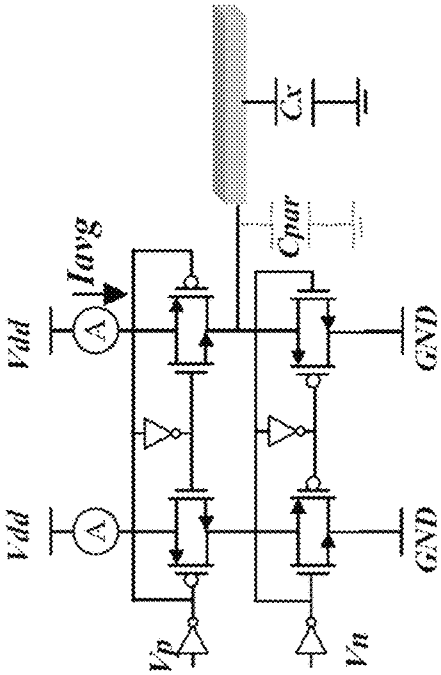
FIG. 1C (PRIOR ART)
Figure 1D:
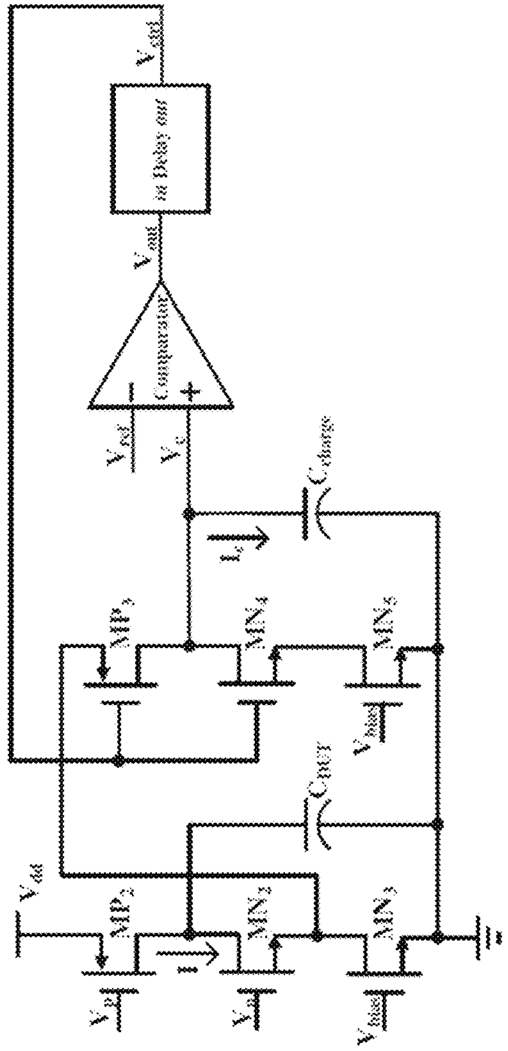
FIG. 1D (PRIOR ART)

FIG. 1D is a circuit diagram of another previously proposed capacitance measurement approach. This approach has the same drawbacks as the approach in FIG. 1C. In addition, the complementary metal-oxide-semiconductor (CMOS) transistors and drivers in FIGS. 1C and 1D must be able to handle relatively large current spikes during charging and discharging, which increases chip area.

SUMMARY

Embodiment 1. A method for measuring on-chip capacitance, the method including: disconnecting a target capacitance from a main circuit of an integrated circuit; connecting the target capacitance to a relaxation oscillator on the integrated circuit; measuring an output of the relaxation oscillator; and measuring the target capacitance based on the measured output, wherein: the target capacitance is measured based on an output frequency of the relaxation oscillator; and the target capacitance is measured further based on a measured voltage and measured currents of the relaxation oscillator.

Embodiment 2. The method of embodiment 1, further including disconnecting the target capacitance from the main circuit simultaneously with connecting the target capacitance to the relaxation oscillator.

Embodiment 3. The method of embodiment 1, further including tuning the target capacitance based on the measured target capacitance.

Embodiment 4. The method of embodiment 1, wherein the target capacitance includes a first capacitor and a second capacitor associated with a crystal oscillator.

Embodiment 5. The method of embodiment 4, wherein disconnecting the target capacitance includes disconnecting a crystal oscillator core of the crystal oscillator from the main circuit.

Embodiment 6. The method of embodiment 4, further including measuring a second capacitance of the second capacitor based on the output of the relaxation oscillator.

Embodiment 7. The method of embodiment 6, further including measuring a first capacitance of the first capacitor based on the measured second capacitance and another output of the relaxation oscillator.

Embodiment 8. The method of embodiment 7, wherein measuring the target capacitance includes determining a first target capacitance based on the first capacitance.

Embodiment 9. The method of embodiment 8, further including tuning the first capacitor to the first target capacitance.

Embodiment 10. An integrated circuit, including: a main circuit; a relaxation oscillator; switching circuitry configured to selectively connect a target capacitance to the main circuit or to the relaxation oscillator, wherein the switching circuitry includes: a first switch coupled between the main circuit and the target capacitance; and a second switch coupled between a capacitor and the target capacitance, wherein a selection signal selectively causes the first switch to close simultaneously with the second switch opening and the first switch to open simultaneously with the second switch closing; and a measurement block configured to measure the target capacitance based on an output of the relaxation oscillator.

Embodiment 11. The integrated circuit of embodiment 10, wherein the relaxation oscillator is configured to be disabled when disconnected from the target capacitance.

Embodiment 12. The integrated circuit of embodiment 10, wherein the measurement block includes voltage measurement circuitry, current measurement circuitry, and frequency measurement circuitry.

Embodiment 13. The integrated circuit of embodiment 12, wherein the target capacitance includes a first capacitor and a second capacitor associated with a crystal oscillator.

Embodiment 14. The integrated circuit of embodiment 10, wherein the target capacitance includes a digitally controlled capacitor bank.

Embodiment 15. A tuning circuit, including: a relaxation oscillator; switching circuitry configured to selectively disconnect a target capacitance from a main circuit and connect the target capacitance to the relaxation oscillator; a measurement block configured to measure a value of the target capacitance based on an output frequency, a measured voltage, and measured currents of the relaxation oscillator; and a tuning block configured to adjust the target capacitance based on the measured value.

Embodiment 16. The tuning circuit of embodiment 15, wherein the measurement block includes voltage measurement circuitry, current measurement circuitry, and frequency measurement circuitry.

Embodiment 17. The tuning circuit of embodiment 16, wherein the tuning block is configured to cause: the voltage measurement circuitry to measure the measured voltage associated with the target capacitance; the current measurement circuitry to measure the measured current through the relaxation oscillator; and the frequency measurement circuitry to measure the output frequency of the relaxation oscillator.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
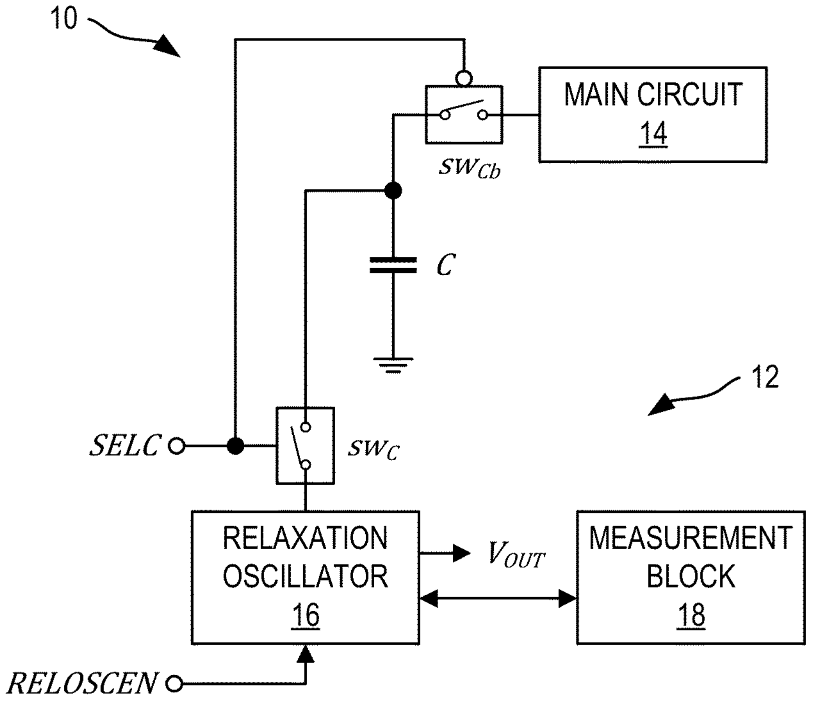
Figure 3A:
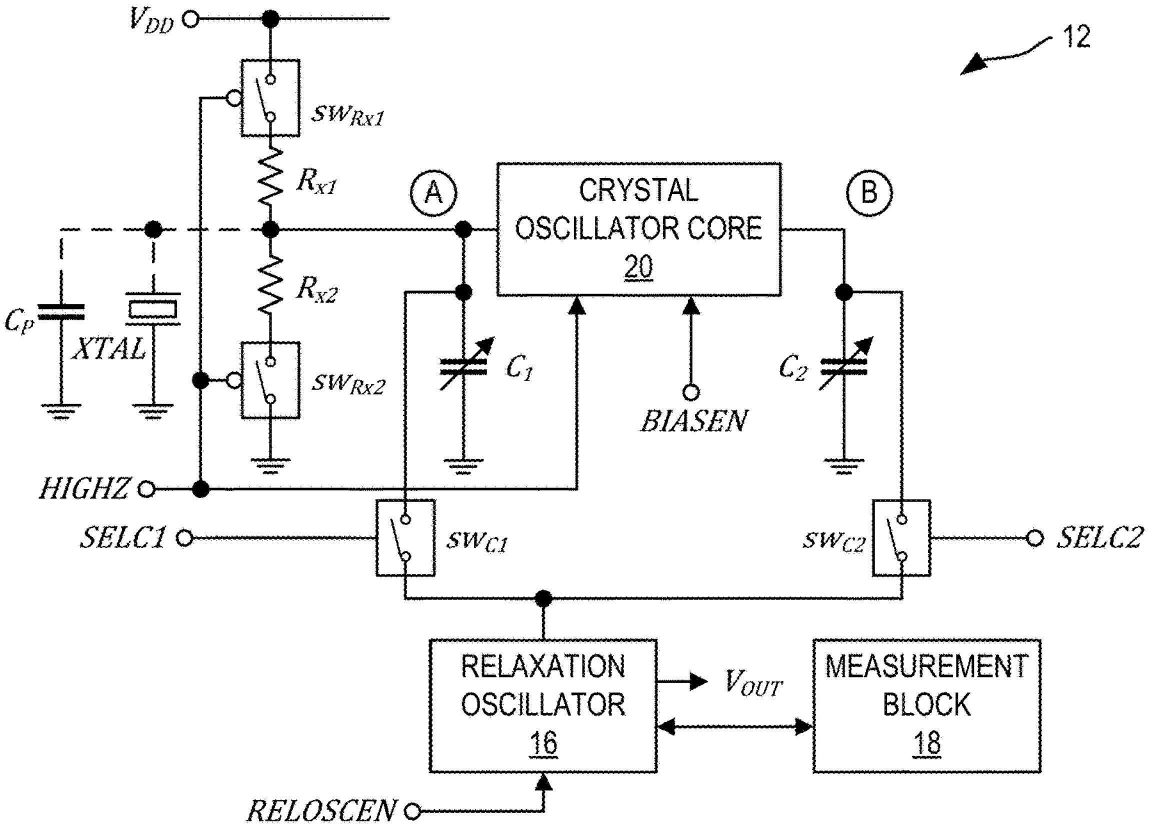
Figure 3B:
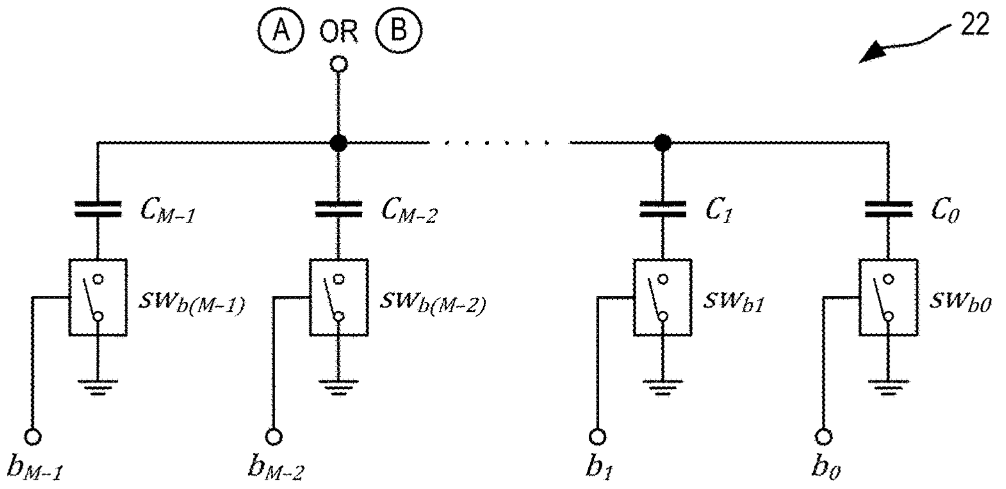
Figure 4:
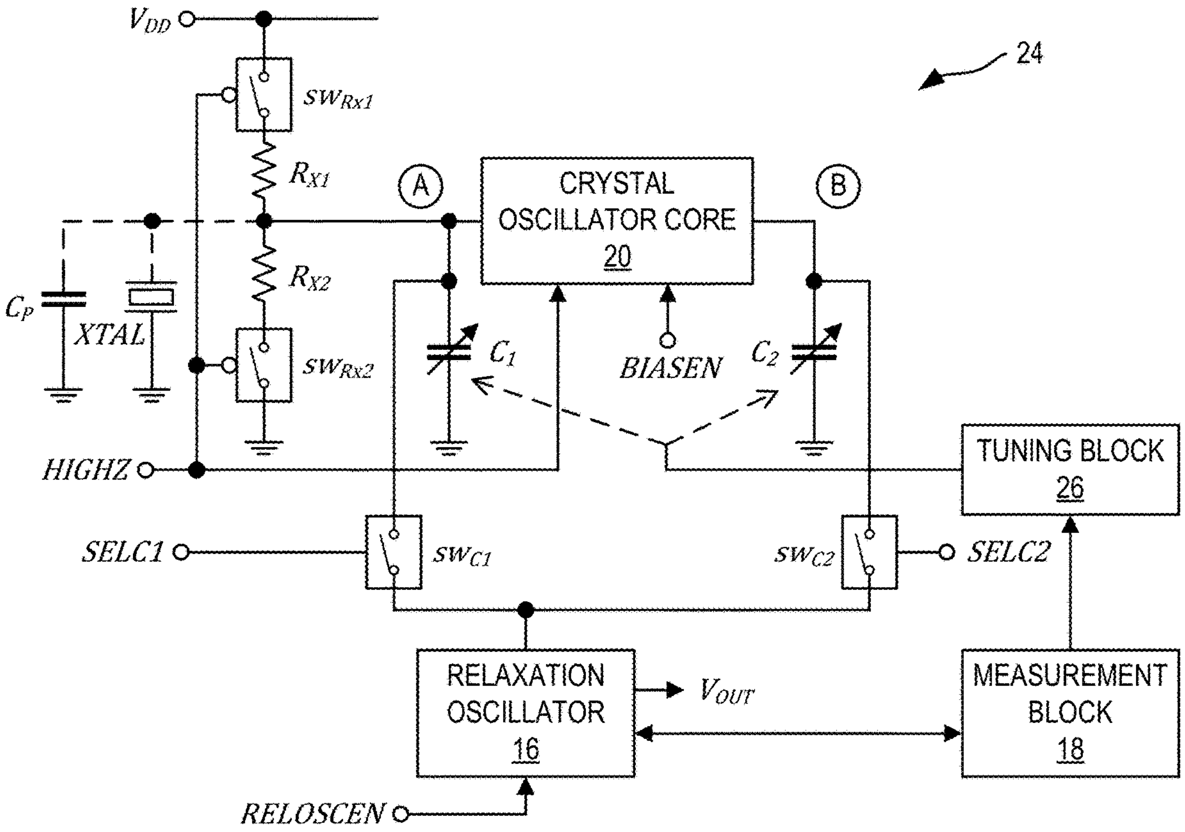
Figure 5:
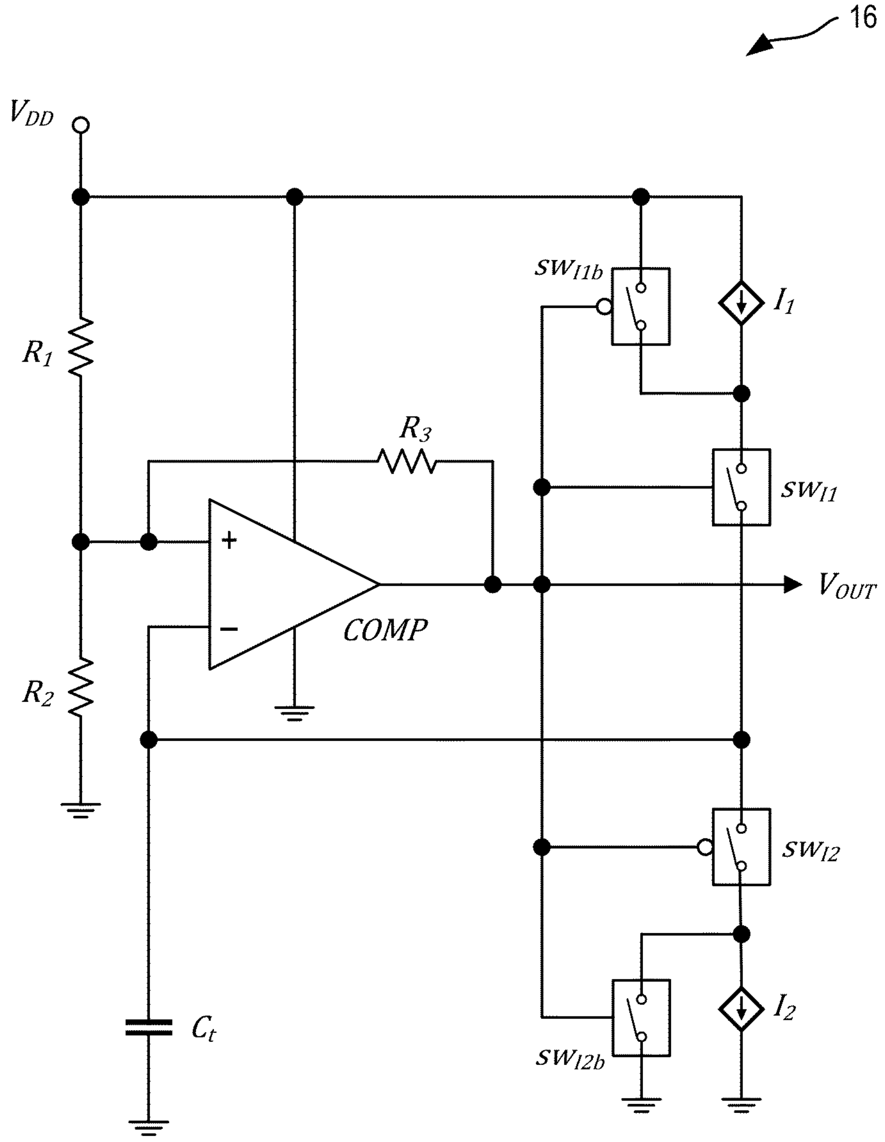
Figure 6:
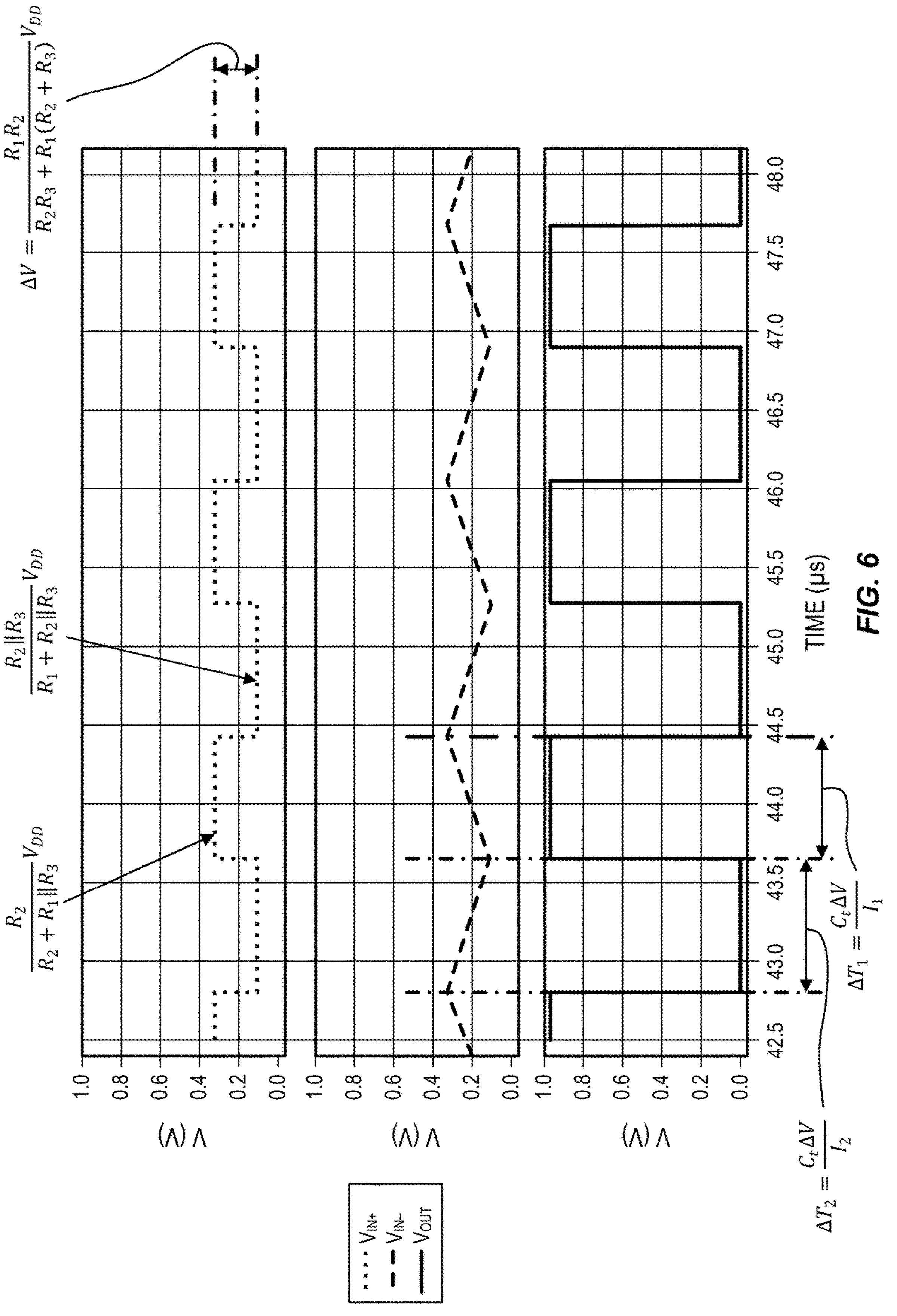
Figure 7:
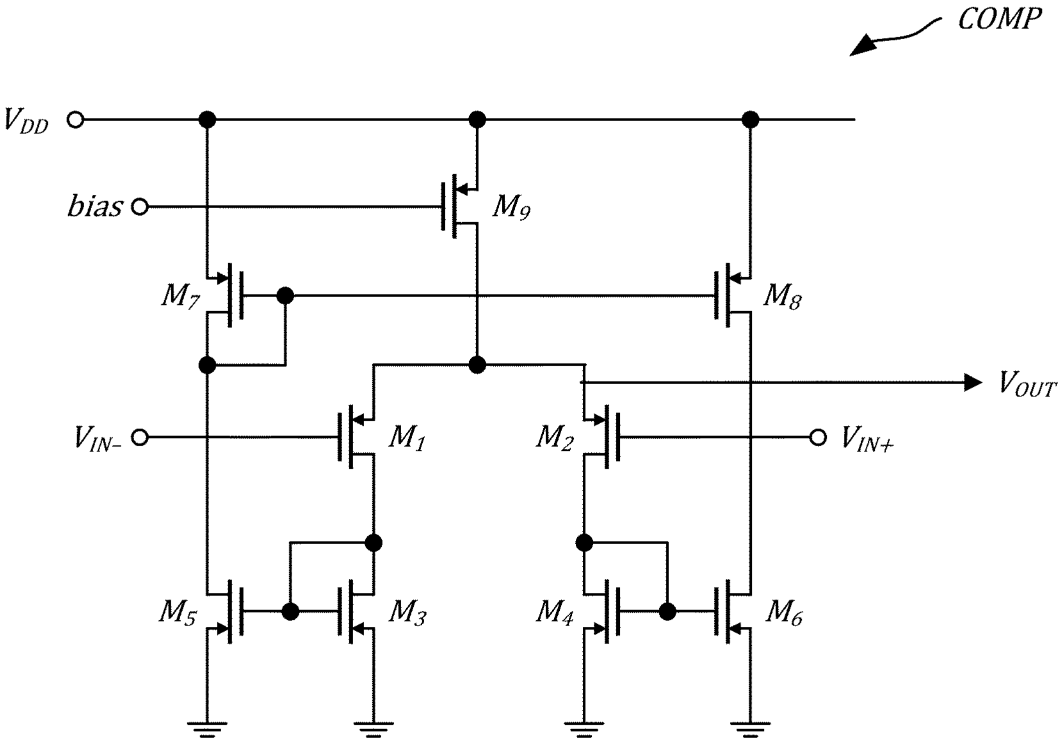
Figure 8:
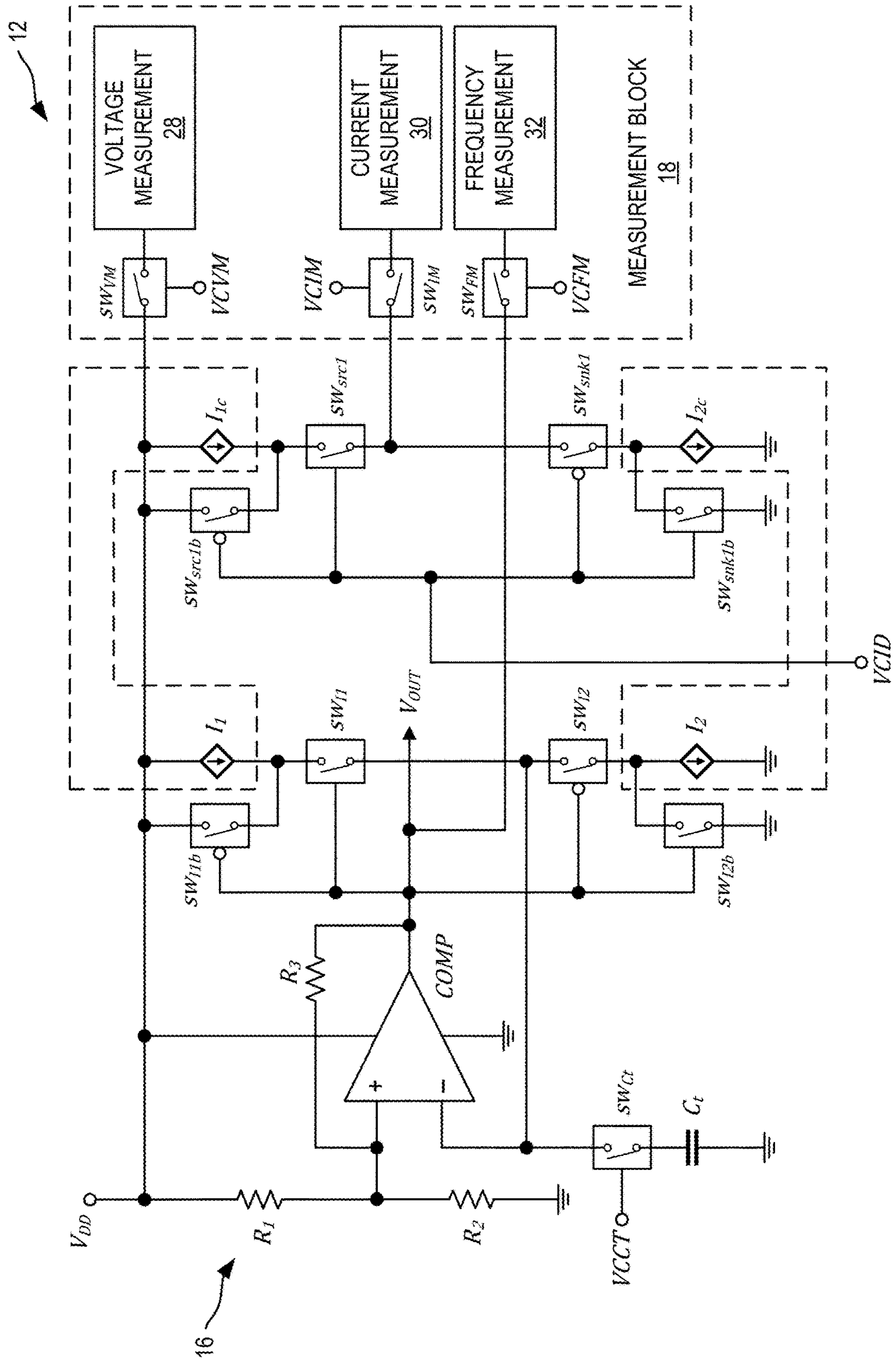
Figure 9:
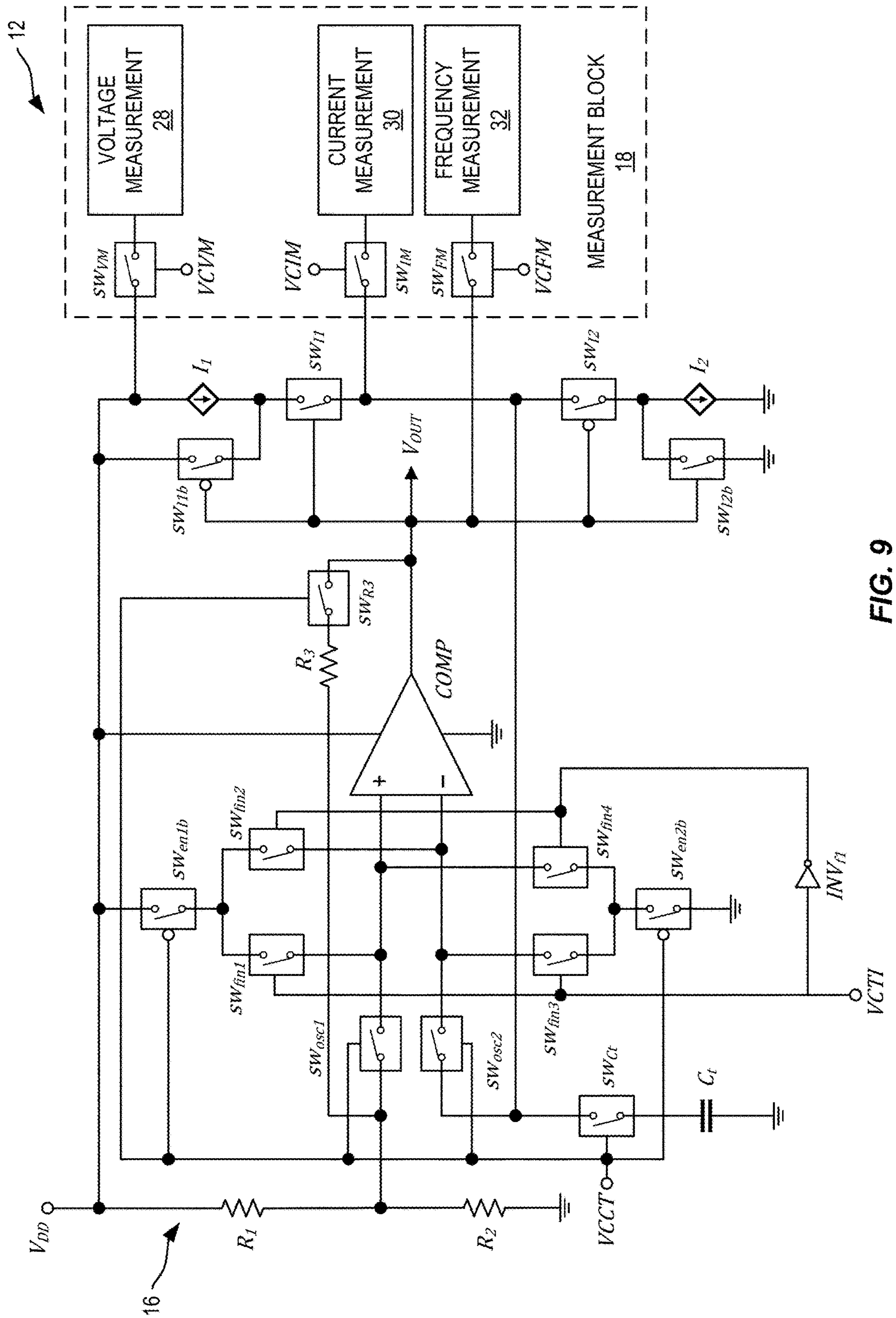
Figure 10:
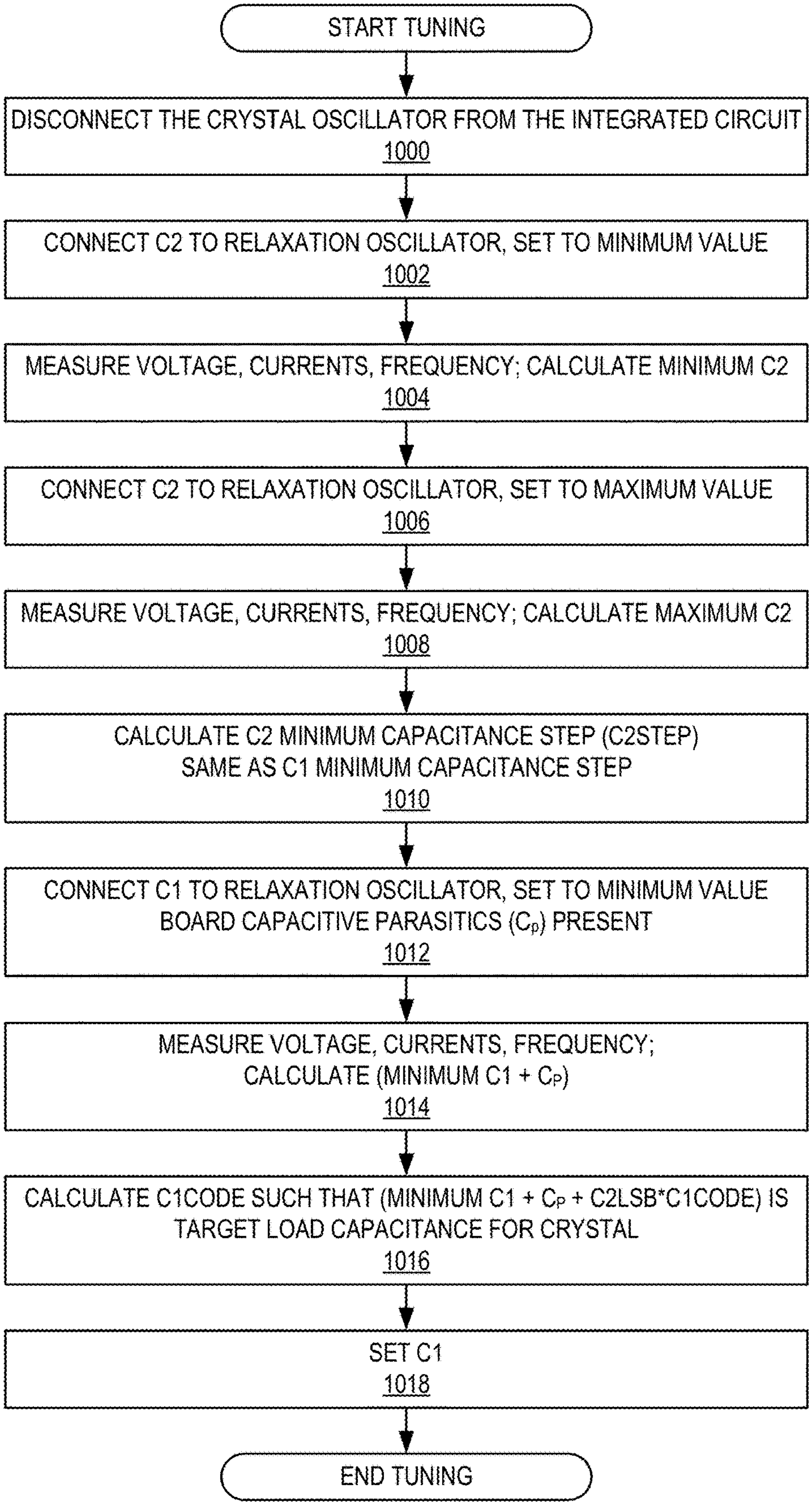
Figure 11:
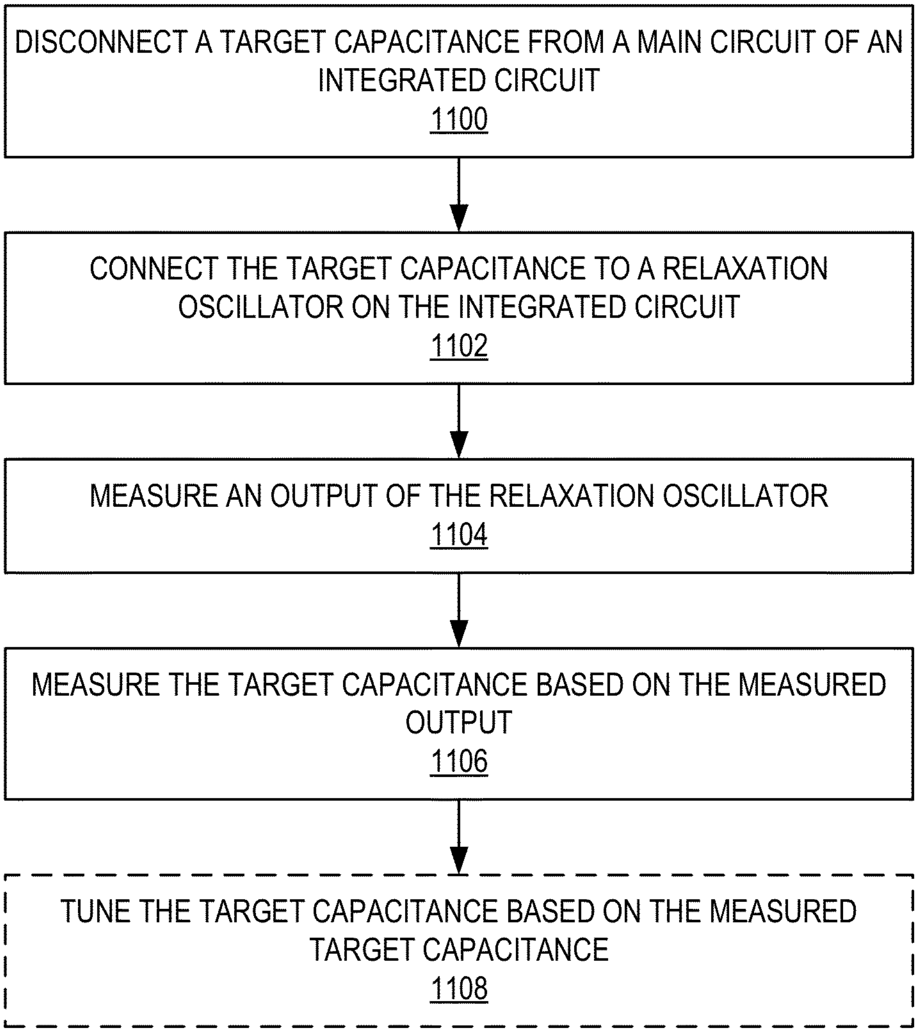
Figure 12:
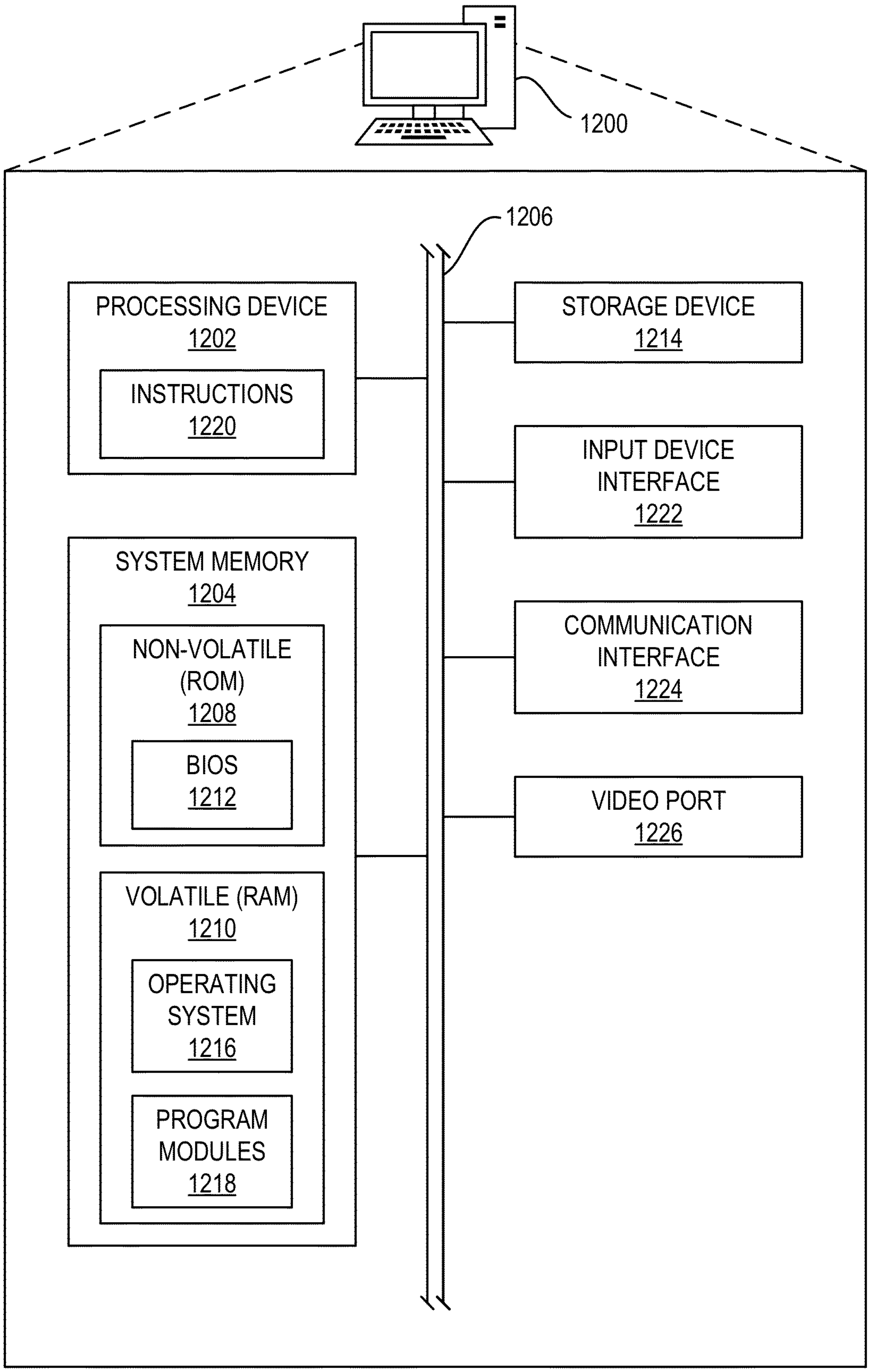

FIG. 1A is a circuit diagram of a previously proposed capacitance measurement approach based on measurement of transient currents;

FIG. 1B is a circuit diagram of another previously proposed capacitance measurement approach based on measuring amplitudes of sinusoidal signals;

FIG. 1C is a circuit diagram of another previously proposed capacitance measurement approach;

FIG. 1D is a circuit diagram of another previously proposed capacitance measurement approach;

FIG. 2 is a schematic block diagram of an integrated circuit with a measurement circuit, according to the present disclosure;

FIG. 3A is a schematic diagram of an exemplary embodiment of the measurement circuit of FIG. 2;

FIG. 3B is a schematic diagram of an exemplary digitally controlled capacitor bank for the measurement circuit of FIG. 3A;

FIG. 4 is a schematic diagram of an exemplary tuning circuit for the integrated circuit of FIG. 2;

FIG. 5 is a schematic diagram of an exemplary relaxation oscillator for the integrated circuit of FIG. 2;

FIG. 6 is a graphical representation of exemplary waveforms of the relaxation oscillator of FIG. 5;

FIG. 7 is a schematic diagram of an exemplary comparator for the relaxation oscillator of FIG. 5;

FIG. 8 is a schematic diagram of another exemplary embodiment of the measurement circuit of FIG. 2;

FIG. 9 is a schematic diagram of another exemplary embodiment of the measurement circuit of FIG. 2;

FIG. 10 is a flow diagram of a tuning algorithm for the tuning circuit of FIG. 4;

FIG. 11 is a flow diagram of a process for measuring on-chip capacitance; and FIG. 12 is a block diagram of a computer system suitable for implementing on-chip capacitance measurement and/or tuning, according to embodiments disclosed herein.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

An on-chip capacitance measurement method and associated systems and devices are provided. Embodiments described herein rely on using the capacitor under test in an on-chip relaxation oscillator configuration whose charging/discharging currents, supply voltage, and output frequency are measured individually in a measurement block. The voltage thresholds of the relaxation oscillator are calculated from the circuit elements and the measured supply voltage. Because the oscillation frequency of the relaxation oscillator is a function of the capacitance under test, the charging/discharging currents, and the supply voltage (via voltage thresholds), the capacitance under test can be calculated using the measured values of the other quantities.

By using digitally controlled switches and other dedicated circuitry, a capacitor normally associated with other circuits (such as crystal oscillators) can be tested by putting the main circuit where the capacitor is used in high-impedance (high-Z) mode and connecting the capacitor to the relaxation oscillator for measurement. After the measurement is done, the capacitor is disconnected from the relaxation oscillator and the main circuit is returned to the normal mode. This can be done for a multiplicity of capacitors associated with a given circuit and can also be employed for tuning by adjusting the control code of digitally programmable capacitive loads in cases where highly accurate capacitances must be presented to a resonator for ensuring oscillation at the specified frequency.

Embodiments described herein provide an accurate, low-power, small-area on-chip system capable of measuring capacitance with high accuracy. An algorithm employing the above method and apparatus for tuning a crystal oscillator is also provided. Relevant circuit implementations used in the on-chip measurement system are also disclosed.

FIG. 2 is a schematic block diagram of an integrated circuit 10 with a measurement circuit 12, according to the present disclosure. The measurement circuit 12 measures, on-chip, a single-ended capacitance C associated with the integrated circuit 10, such as an oscillator. In normal operation, when a digital control signal SELC is at logic 0, a switch $sw_C$ is open and a switch $sw_{Cb}$ is closed, connecting the capacitance C to a main circuit 14 with which it is associated. When the digital control signal SELC is at logic 1, the switch $sw_C$ is closed and the switch $sw_{Cb}$ is open, effectively disconnecting the capacitance C from the main circuit 14 and connecting it to a relaxation oscillator 16 (present on the same chip) whose frequency is a function of the capacitance C and other circuit parameters.

The value of the capacitance C is measured with high accuracy by measuring the output frequency of the relaxation oscillator 16, and all the quantities involved in producing its output waveform (such as voltage thresholds and charging/discharging currents) using dedicated circuitry in a measurement block 18. This information may then be used in determining other quantities of interest associated with the main circuit 14 (e.g., its own oscillation frequency), once the capacitance C is reconnected to the main circuit 14 (e.g., by setting the digital control signal SELC to logic 0). In some embodiments, the relaxation oscillator 16 can be enabled or disabled by a control signal RELOSCEN.

FIG. 3A is a schematic diagram of an exemplary embodiment of the measurement circuit 12 of FIG. 2. Here, two adjustable capacitors $C_1$, $C_2$ primarily associated with a van den Homberg crystal XTAL oscillator can be functionally disconnected from a crystal oscillator core 20 and can be, in turn, connected to the relaxation oscillator 16 via switches $sw_{C1}$, $sw_{C2}$, respectively. The switches $sw_{C1}$, $sw_{C2}$ can be controlled by capacitor select signals SELC1, SELC2, respectively.

The functional disconnect from the crystal oscillator core 20 can be achieved by putting the crystal oscillator core 20 in high-impedance (high-Z) mode (e.g., by cutting off its supply current) using a control signal HIGHZ, and by disconnecting the rest of the circuit (such as bias resistors $R_{x1}$, $R_{x2}$) using the switches (such as switches $sw_{Rx1}$, $sw_{Rx2}$, respectively). The rest of the measurement circuit 12 in FIG. 3A is similar in form and function to the diagram of FIG. 2.

FIG. 3B is a schematic diagram of an exemplary digitally controlled capacitor bank 22 for the measurement circuit 12 of FIG. 3A. In an exemplary aspect, one or both of the capacitors $C_1$, $C_2$ can be implemented as the digitally controlled capacitor banks 22. Each of the digitally controlled capacitor banks 22 can include M different capacitors $C_0, C_1, \ldots, C_{M-1}$ selectively connected to a node A (for the capacitor $C_1$) or a node B (for the capacitor $C_2$) of FIG. 3A using corresponding switches $sw_{b0}, sw_{b1}, \ldots, sw_{b(M-1)}$ (e.g., using control signals $b_0, b_1, \ldots, b_{M-1}$). It should be understood that the digitally controlled capacitor bank 22 of FIG. 3B is illustrative in nature and other circuit arrangements may be used in other embodiments.

FIG. 4 is a schematic diagram of an exemplary tuning circuit 24 for the integrated circuit 10 of FIG. 2. The tuning circuit 24 is similar to the measurement circuit 12, with a tuning block 26 added to control the settings for the capacitors $C_1$, $C_2$ associated with the crystal oscillator core 20. Accordingly, in an exemplary aspect, the tuning block 26 provides digital control for one or more of the digitally controlled capacitor banks 22 as in FIG. 3B.

The tuning block 26 controls the capacitors $C_1$, $C_2$ based on the data extracted by means of the relaxation oscillator 16 and the measurement block 18. In some examples, the capacitor $C_1$ cannot be physically separated from a parasitic capacitance $C_P$ when the switch $sw_{c1}$ is closed, and the tuning algorithm must take this aspect into account. For tuning purposes (e.g., connecting the specified capacitance C in parallel with the crystal oscillator core 20), if the capacitors $C_1$, $C_2$ are identical, all the information relevant to the capacitor $C_1$ (in particular, the size of the minimum capacitance C step) can be extracted by measuring the capacitor $C_2$, which does not have any of the board parasitic capacitance $C_P$ connected in parallel to it. By measuring the capacitor $C_1$ at the minimum setting (together with the parasitic capacitance $C_P$), the previously extracted capacitance C step using the capacitor $C_2$ can be used to calculate the target value of the $(C_1+C_P)$ combination. This tuning algorithm is further discussed below with respect to FIG. 10.

The tuning block 26 and/or the measurement block 18 can be implemented using discrete gate or transistor logic, discrete hardware components, or any combination thereof designed to perform the functions described herein. In some embodiments, the tuning block 26 and/or the measurement block 18 may be implemented with a microprocessor or any conventional processor, controller, microcontroller, or state machine.

FIG. 5 is a schematic diagram of an exemplary one of the relaxation oscillator 16 for the integrated circuit 10 of FIG. 2. Here, a test $C_t$ is the capacitance C under test. A comparator COMP provides an output $V_{OUT}$ based on an inverting input and a noninverting input. A first resistor $R_1$ is connected between a supply voltage $V_{DD}$ and the noninverting input, and a second resistor $R_2$ is connected between the noninverting input and ground (e.g., forming a voltage divider coupled to the noninverting input). A third resistor $R_3$ is connected between the output $V_{OUT}$ and the noninverting input. The resistor arrangement permits the comparator COMP to operate with input voltage ranges that do not include the $V_{DD}/2$ point. This is advantageous in low-voltage systems in that the internal structure of the comparator COMP can be topologically simple and ensure operation of transistors away from the triode region (in CMOS implementations).

The capacitance C under the test $C_t$ is connected between the inverting input of the comparator COMP and ground. A first current source $I_1$ is coupled between the supply voltage $V_{DD}$ and the inverting input, and a second current source $I_2$ is coupled between the inverting input and ground. The current sources $I_1$, $I_2$ are connected using switches $sw_{I1}$, $sw_{I1b}$ (connected to the first current source $I_1$) and switches $sw_{I2}$, $sw_{I2b}$ (connected to the second current source $I_2$) such that the capacitance C under the test $C_t$ oscillates between being charged and discharged.

In this regard, the enabling inputs of the switches $sw_{I1}$, $sw_{I1b}$, $sw_{I2}$, $sw_{I2b}$ are connected to the output $V_{OUT}$ such that, in a first period, the first current source $I_1$ is connected to the inverting input such that the capacitance C under the test $C_t$ is charged while the second current source $I_2$ is disconnected. Once the capacitance C under the test $C_t$ is charged, in a second period, the first current source $I_1$ is disconnected and the second current source $I_2$ is connected to the inverting input such that the capacitance C under the test $C_t$ is discharged.

FIG. 6 is a graphical representation of exemplary waveforms of the relaxation oscillator 16 of FIG. 5. With the notations in FIG. 6, assuming rail-to-rail swing of the output $V_{OUT}$ of the comparator COMP, the following equations can be derived for the circuit of FIG. 5:

$$V_{UTH} = \frac{R_2}{R_2 + R_1 \| R_3} V_{DD} \quad \text{Equation 1}$$

$$V_{LTH} = \frac{R_2 \| R_3}{R_2 + R_2 \| R_3} V_{DD} \quad \text{Equation 2}$$

$$\Delta V = V_{UTH} - V_{LTH} = \frac{R_1 R_2}{R_2 R_3 + R_1 (R_2 + R_3)} V_{DD} \quad \text{Equation 3}$$

$$\Delta T_1 = \frac{C_t \cdot \Delta V}{I_1} \quad \text{Equation 4}$$

$$\Delta T_2 = \frac{C_t \cdot \Delta V}{I_2} \quad \text{Equation 5}$$

$$f_{OUT} = \frac{1}{\Delta T_1 + \Delta T_2} = \frac{I_1 I_2}{C_t \cdot \Delta V (I_1 + I_2)} \quad \text{Equation 6}$$

In the above equations, the current sources $I_1$, $I_2$ are the capacitor charging and discharging currents, respectively. Voltage thresholds $V_{UTH}$, $V_{LTH}$ are the upper and lower voltage thresholds, respectively, of the relaxation oscillator 16. $\Delta T_1$ and $\Delta T_2$ are the capacitor charging and discharging times, respectively. The output frequency of the relaxation oscillator 16 is obtained according to Equation 6, being a function of the current sources $I_1$, $I_2$, $\Delta V$ (and implicitly a function of the supply voltage $V_{DD}$ through Equation 3), and the test $C_t$.

From Equation 6, if the current sources $I_1$, $I_2$ and the supply voltage $V_{DD}$ are known or can be accurately measured (assuming the resistors $R_1$, $R_2$, $R_3$ are accurately known from the design of the circuit, which permits the accurate calculation of the voltage thresholds $V_{UTH}$, $V_{LTH}$ and $\Delta V$ according to Equations 1, 2, and 3) and if the output frequency of the relaxation oscillator 16 can be measured accurately, then the capacitance C under the test $C_t$ can be obtained as:

$$C_t = \frac{I_1 I_2}{f_{OUT} \cdot \Delta V (I_1 + I_2)} \quad \text{Equation 7}$$

where $\Delta V$ is given by Equation 3. In accordance with embodiments described herein, the measurement block 18 in FIG. 2, 3A, or 4 performs the measurement of the current sources $I_1$, $I_2$, the supply voltage $V_{DD}$, and $f_{OUT}$ and calculates the test $C_t$ using Equation 7 and the known values of the resistors $R_1$, $R_2$, $R_3$.

FIG. 7 is a schematic diagram of an exemplary one of the comparator COMP for the relaxation oscillator 16 of FIG. 5. This illustrates a CMOS implementation of the comparator COMP using field-effect transistors (FETs), though the comparator COMP may also be implemented using bipolar junction transistors (BJTs) or other types of transistors. The inverting input is connected to the gate of a first transistor $M_1$ (e.g., a p-type metal-oxide semiconductor (PMOS) field-effect transistor (FET) (MOSFET)) and the noninverting input is connected to the gate of a second transistor $M_2$ (e.g., a PMOS). The first transistor $M_1$ is connected in series with a complementary third transistor $M_3$ (e.g., an n-type metal-oxide semiconductor (NMOS) FET (MOSFET)), which is connected to ground. Similarly, the second transistor $M_2$ is connected in series with a complementary fourth transistor $M_4$ (e.g., an NMOS), which is connected to ground. The gates of the third transistor $M_3$ and the fourth transistor $M_4$ are connected to the gates of a corresponding fifth transistor $M_5$ and a sixth transistor $M_6$, respectively. These gates are further connected to the corresponding drains of the third transistor $M_3$ and the fourth transistor $M_4$.

The fifth transistor $M_5$ is connected in series with a complementary seventh transistor $M_7$ (e.g., a PMOS), which is connected to the supply voltage $V_{DD}$. Similarly, the sixth transistor $M_6$ is connected in series with a complementary eighth transistor $M_8$ (e.g., a PMOS), which is connected to the supply voltage $V_{DD}$. The gates of the seventh transistor $M_7$ and the eighth transistor $M_8$ are connected together and to the drain of the seventh transistor $M_7$.

Finally, a ninth transistor $M_9$ (e.g., a PMOS) is connected between the supply voltage $V_{DD}$ and the sources of the first transistor $M_1$ and the second transistor $M_2$. The output $V_{OUT}$ of the comparator COMP is connected to the drain of the ninth transistor $M_9$ and the sources of the first transistor $M_1$ and the second transistor $M_2$. A bias signal bias for the comparator COMP is connected to the gate of the ninth transistor $M_9$.

FIG. 8 is a schematic diagram of another exemplary embodiment of the measurement circuit 12 of FIG. 2. Copies $I_{1c}$, $I_{2c}$, of the charging and discharging current sources $I_1$, $I_2$, respectively, of the relaxation oscillator 16 are fed to the measurement block 18. The measurement block 18 includes voltage measurement circuitry 28, current measurement circuitry 30, and frequency measurement circuitry 32. These circuits are selectively connected using a voltage measurement switch $sw_{VM}$ (controlled by a signal VCVM), a current measurement switch $sw_{IM}$ (controlled by a signal VCIM), and a frequency measurement switch $sw_{FM}$ (controlled by a signal VCFM).

When the current measurement switch $sw_{IM}$ is closed (e.g., the signal VCIM is logic 1), the currents to be measured are selected by a control signal VCID. More specifically, if the control signal VCID is at logic 0, then switches $sw_{snk1}$, $sw_{src1b}$ are closed and switches $sw_{snk1b}$, $sw_{src1}$ are open, which connects the copy $I_{2c}$ to the measurement block 18 (e.g., the current measurement circuitry 30). If the control signal VCID is at logic 1, then the switches $sw_{snk1}$, $sw_{src1b}$ are open and the switches $sw_{snk1b}$, $sw_{src1}$ are closed, which connects the copy $I_{1c}$ to the measurement block 18.

In the configuration shown in FIG. 8, it is not necessary to stop the relaxation oscillator 16 from oscillating when measuring the copies $I_{1c}$, $I_{2c}$ because these currents are copies of the actual charging and discharging current sources $I_1$, $I_2$ of the relaxation oscillator 16 and have no effect on its actual operation. Therefore, the configuration of FIG. 8 allows for a rapid measurement of all the quantities needed in the calculation of the test $C_t$ from Equation 7.

FIG. 9 is a schematic diagram of another exemplary embodiment of the measurement circuit 12 of FIG. 2. Here, the actual charging and discharging current sources $I_1$, $I_2$ of the relaxation oscillator 16 are fed to the measurement block 18. In this way, the measurement accuracy of the capacitance C under the test $C_t$ is improved by eliminating the errors associated with copying the current sources $I_1$, $I_2$ (which was illustrated in FIG. 8). To achieve this, a control signal VCCT set to logic 0 performs the essential function of stopping the oscillation of the relaxation oscillator 16 by disconnecting the inputs of the comparator COMP and the feedback resistor $R_3$ from the relaxation oscillator 16 feedback loop (by opening switches $sw_{osc1}$, $sw_{osc2}$, $sw_{R3}$) and allowing forced large direct current (DC) voltages to be applied to the inputs of the comparator COMP by closing switches $sw_{en1b}$, $sw_{en2b}$.

The polarity of the forced large DC voltages is controlled by a signal VCTI and its associated control inverter $INV_{f1}$. Thus, when the signal VCTI is at logic 0, the output of the control inverter $INV_{f1}$ is at logic 1, switches $sw_{fin1}$, $sw_{fin3}$ are open, switches $sw_{fin2}$, $sw_{fin4}$ are closed, the noninverting input of the comparator COMP is at ground, the inverting input of the comparator COMP is at the supply voltage $V_{DD}$, causing the output $V_{OUT}$ to be at ground, thus closing $sw_{I1b}$, $sw_{I2}$ and opening $sw_{I1}$, $sw_{I2b}$, in this way sending the second current source $I_2$ to the measurement block 18 as a sink current. When the signal VCTI is at logic 1, the output of the control inverter $INV_{f1}$ is at logic 0, the switches $sw_{fin1}$, $sw_{fin3}$ are closed, the switches $sw_{fin2}$, $sw_{fin4}$ are open, the noninverting input of the comparator COMP is at the supply voltage $V_{DD}$, the inverting input of the comparator COMP is at ground, causing the output $V_{OUT}$ to be at the supply voltage $V_{DD}$, thus opening $sw_{I1b}$, $sw_{I2}$ and closing $sw_{I1}$, $sw_{I2b}$, in this way sending the first current source $I_1$ to the measurement block 18 as a source current.

Unlike in FIG. 8, in the embodiment of FIG. 9, it is necessary to stop the relaxation oscillator 16 from oscillating when measuring the current sources, $I_1$, $I_2$, therefore the frequency measurement cannot be done at the same time as measuring the current sources $I_1$, $I_2$, which causes the overall measurement process to be slower. However, there is improved accuracy relative to the embodiment of FIG. 8, because the errors associated with current copying are eliminated.

FIG. 10 is a flow diagram of a tuning algorithm for the tuning circuit 24 of FIG. 4. This algorithm is described with reference to the capacitance C measurement approaches, as described above with respect to FIGS. 8 and 9. The algorithm begins with disconnecting the crystal oscillator core 20 from the integrated circuit 10 (block 1000). The adjustable capacitor $C_2$ is then connected to the relaxation oscillator 16 and set to its minimum value (block 1002). The voltage, currents, and frequency are measured and used to calculate the minimum value of the capacitor $C_2$ (block 1004).

The capacitor $C_2$ is connected to the relaxation oscillator 16 and set to its maximum value (block 1006). The voltage, currents, and frequency are measured and used to calculate the maximum value of the capacitor $C_2$ (block 1008). The capacitor $C_2$ minimum of the capacitance C step value $C_{2STEP}$ is then calculated (block 1010). By design, the step value $C_{2STEP}$ is the same as the capacitor $C_1$ minimum of the capacitance C step value $C_{1STEP}$.

The adjustable capacitor $C_1$ is then connected to the relaxation oscillator 16 and set to its minimum value (block 1012). The board parasitic capacitance $C_P$ is present as it is connected to the capacitor $C_1$. The voltage, currents, and frequency are measured and used to calculate the minimum value of $(C_1+C_P)$ (block 1014). $C_{1CODE}$ is calculated such that the minimum value of $(C_1+C_P+C_{2LSB}*C_{1CODE})$ is the target load capacitance for the crystal oscillator core 20 (block 1016). Finally, the value of the capacitor $C_1$ is set using $C_{1CODE}$ (block 1018).

FIG. 11 is a flow diagram of a process for measuring on-chip capacitance. Dashed boxes represent optional steps. The process begins at operation 1100, with disconnecting a target capacitance from a main circuit of an integrated circuit. In an exemplary aspect, the target capacitance is disconnected from the main circuit simultaneously with connecting the target capacitance to the relaxation oscillator. The process continues at operation 1102, with connecting the target capacitance to a relaxation oscillator on the integrated circuit.

The process continues at operation 1104, with measuring an output of the relaxation oscillator. The measured output may be one or more of a voltage (e.g., a threshold voltage), a current (e.g., currents through the relaxation oscillator), or a frequency (e.g., a frequency of an output of the relaxation oscillator). The process continues at operation 1106, with measuring the target capacitance based on the measured output. The process optionally continues at operation 1108, with tuning the target capacitance based on the measured target capacitance.

In an exemplary aspect, the target capacitance includes two capacitors associated with a crystal oscillator. As described above with respect to FIG. 10, the capacitances C of the two capacitors $C_1$, $C_2$ may be measured in sequence, beginning with the second capacitor $C_2$, which is not connected to the parasitic capacitance $C_P$. One or both of the capacitors $C_1$, $C_2$ may be tuned based on the measured capacitance C.

Although the operations of FIGS. 10 and 11 are illustrated in a series, this is for illustrative purposes and the operations are not necessarily order dependent. Some operations may be performed in a different order than that presented. For example, operations 1100 and 1102 may be performed simultaneously. Further, processes within the scope of this disclosure may include fewer or more steps than those illustrated in FIGS. 10 and 11.

FIG. 12 is a block diagram of a computer system 1200 suitable for implementing on-chip capacitance measurement and/or tuning, according to embodiments disclosed herein. The computer system 1200 comprises any computing or electronic device capable of including firmware, hardware, and/or executing software instructions that could be used to perform any of the methods or functions described above. In this regard, the computer system 1200 may be a circuit or circuits included in an electronic board card, such as a printed circuit board (PCB), a server, a personal computer, a desktop computer, a laptop computer, an array of computers, a personal digital assistant (PDA), a computing pad, a mobile device, or any other device, and may represent, for example, a server or a user's computer.

The exemplary computer system 1200, in this embodiment, includes a processing device 1202 or processor, a system memory 1204, and a system bus 1206. The processing device 1202 represents one or more commercially available or proprietary general-purpose processing devices, such as a microprocessor, central processing unit (CPU), or the like. More particularly, the processing device 1202 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 1202 is configured to execute processing logic instructions for performing the operations and steps discussed herein.

In this regard, the various illustrative logical blocks, modules, and circuits described in connection with the embodiments disclosed herein may be implemented or performed with the processing device 1202, which may be a microprocessor, field programmable gate array (FPGA), a digital signal processor (DSP), an application-specific integrated circuit (ASIC), or another programmable logic device, a discrete gate or transistor logic, discrete hardware components, or any combination thereof designed to perform the functions described herein. Furthermore, the processing device 1202 may be a microprocessor, or may be any conventional processor, controller, microcontroller, or state machine. The processing device 1202 may also be implemented as a combination of computing devices (e.g., a combination of a DSP and a microprocessor, a plurality of microprocessors, one or more microprocessors in conjunction with a DSP core, or any other such configuration).

The system memory 1204 may include non-volatile memory 1208 and volatile memory 1210. The non-volatile memory 1208 may include read-only memory (ROM), erasable programmable read-only memory (EPROM), electrically erasable programmable read-only memory (EEPROM), and the like. The volatile memory 1210 generally includes random-access memory (RAM) (e.g., dynamic RAM (DRAM), such as synchronous DRAM (SDRAM)). A basic input/output system (BIOS) 1212 may be stored in the non-volatile memory 1208 and can include the basic routines that help to transfer information between elements within the computer system 1200.

The system bus 1206 provides an interface for system components including, but not limited to, the system memory 1204 and the processing device 1202. The system bus 1206 may be any of several types of bus structures that may further interconnect to a memory bus (with or without a memory controller), a peripheral bus, and/or a local bus using any of a variety of commercially available bus architectures.

The computer system 1200 may further include or be coupled to a non-transitory computer-readable storage medium, such as a storage device 1214, which may represent an internal or external hard disk drive (HDD), flash memory, or the like. The storage device 1214 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer (such as optical disks, magnetic cassettes, flash memory cards, cartridges, and the like) may also be used in the operating environment, and, further, that any such media may contain computer-executable instructions for performing novel methods of the disclosed embodiments.

An operating system 1216 and any number of program modules 1218 or other applications can be stored in the volatile memory 1210, wherein the program modules 1218 represent a wide array of computer-executable instructions corresponding to programs, applications, functions, and the like that may implement the functionality described herein in whole or in part, such as through instructions 1220 on the processing device 1202. The program modules 1218 may also reside on the storage mechanism provided by the storage device 1214. As such, all or a portion of the functionality described herein may be implemented as a computer program product stored on a transitory or non-transitory computer-usable or computer-readable storage medium, such as the storage device 1214, the volatile memory 1210, the non-volatile memory 1208, the instructions 1220, and the like. The computer program product includes complex programming instructions, such as complex computer-readable program code, to cause the processing device 1202 to carry out the steps necessary to implement the functions described herein.

An operator, such as the user, may also be able to enter one or more configuration commands to the computer system 1200 through a keyboard, a pointing device such as a mouse, or a touch-sensitive surface, such as the display device, via an input device interface 1222 or remotely through a web interface, terminal program, or the like via a communication interface 1224. The communication interface 1224 may be wired or wireless and facilitate communications with any number of devices via a communications network in a direct or indirect fashion. An output device, such as a display device, can be coupled to the system bus 1206 and driven by a video port 1226. Additional inputs and outputs to the computer system 1200 may be provided through the system bus 1206 as appropriate to implement embodiments described herein.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A method for measuring on-chip capacitance, the method comprising:
 disconnecting a target capacitance from a main circuit of an integrated circuit;
 connecting the target capacitance to a relaxation oscillator on the integrated circuit;
 measuring an output of the relaxation oscillator; and
 measuring the target capacitance based on the measured output, wherein:
  the target capacitance is measured based on an output frequency of the relaxation oscillator; and
  the target capacitance is measured further based on a measured voltage and measured currents of the relaxation oscillator.

2. The method of claim 1, further comprising disconnecting the target capacitance from the main circuit simultaneously with connecting the target capacitance to the relaxation oscillator.

3. The method of claim 1, further comprising tuning the target capacitance based on the measured target capacitance.

4. The method of claim 1, wherein the target capacitance comprises a first capacitor and a second capacitor associated with a crystal oscillator.

5. The method of claim 4, wherein disconnecting the target capacitance comprises disconnecting a crystal oscillator core of the crystal oscillator from the main circuit.

6. The method of claim 4, further comprising measuring a second capacitance of the second capacitor based on the output of the relaxation oscillator.

7. The method of claim 6, further comprising measuring a first capacitance of the first capacitor based on the measured second capacitance and another output of the relaxation oscillator.

8. The method of claim 7, wherein measuring the target capacitance comprises determining a first target capacitance based on the first capacitance.

9. The method of claim 8, further comprising tuning the first capacitor to the first target capacitance.

10. An integrated circuit, comprising:
 a main circuit;
 a relaxation oscillator;
 switching circuitry configured to selectively connect a target capacitance to the main circuit or to the relaxation oscillator, wherein the switching circuitry comprises:
  a first switch coupled between the main circuit and the target capacitance; and
  a second switch coupled between a capacitor and the target capacitance, wherein a selection signal selectively causes the first switch to close simultaneously with the second switch opening and the first switch to open simultaneously with the second switch closing; and
 a measurement block configured to measure the target capacitance based on an output of the relaxation oscillator.

11. The integrated circuit of claim 10, wherein the relaxation oscillator is configured to be disabled when disconnected from the target capacitance.

12. The integrated circuit of claim 10, wherein the measurement block comprises voltage measurement circuitry, current measurement circuitry, and frequency measurement circuitry.

13. The integrated circuit of claim 12, wherein the target capacitance comprises a first capacitor and a second capacitor associated with a crystal oscillator.

14. The integrated circuit of claim 10, wherein the target capacitance comprises a digitally controlled capacitor bank.

15. A tuning circuit, comprising:
 a relaxation oscillator;
 switching circuitry configured to selectively disconnect a target capacitance from a main circuit and connect the target capacitance to the relaxation oscillator;
 a measurement block configured to measure a value of the target capacitance based on an output frequency, a measured voltage, and measured currents of the relaxation oscillator; and
 a tuning block configured to adjust the target capacitance based on the measured value.

16. The tuning circuit of claim 15, wherein the measurement block comprises voltage measurement circuitry, current measurement circuitry, and frequency measurement circuitry.

17. The tuning circuit of claim 16, wherein the tuning block is configured to cause:
 the voltage measurement circuitry to measure the measured voltage associated with the target capacitance;
 the current measurement circuitry to measure the measured current through the relaxation oscillator; and
 the frequency measurement circuitry to measure the output frequency of the relaxation oscillator.

* * * * *